(12) United States Patent
Farr

(10) Patent No.: US 8,248,739 B2
(45) Date of Patent: Aug. 21, 2012

(54) ELECTRICAL SWITCHING APPARATUS AND PROTECTION APPARATUS DETERMINING THERMAL AGE OF ANOTHER APPARATUS OR A NUMBER OF INSULATORS

(75) Inventor: Lawrence B. Farr, Asheville, NC (US)

(73) Assignee: Eaton Corporation, Cleveland, OH (US)

( * ) Notice: Subject to any disclaimer, the term of this patent is extended or adjusted under 35 U.S.C. 154(b) by 552 days.

(21) Appl. No.: 12/508,677

(22) Filed: Jul. 24, 2009

(65) Prior Publication Data

US 2011/0019318 A1    Jan. 27, 2011

(51) Int. Cl.
*H02H 5/04* (2006.01)

(52) U.S. Cl. ............... 361/25; 361/23; 361/27; 361/62; 361/63; 361/91.2; 361/93.9; 361/158; 361/165; 318/473; 318/455; 318/101; 318/430; 318/442; 376/203; 376/215; 374/102

(58) Field of Classification Search ............ 361/23–25, 361/27, 62, 63, 91.2, 93.9, 158, 165; 73/609; 318/471, 473, 455, 101, 430, 442; 324/557, 324/541, 544, 551; 376/203, 215; 374/102
See application file for complete search history.

(56) References Cited

U.S. PATENT DOCUMENTS

| | | | |
|---|---|---|---|
| 4,432,031 A * | 2/1984 | Premerlani | 361/97 |
| 4,525,763 A * | 6/1985 | Hardy et al. | 361/24 |
| 4,672,501 A * | 6/1987 | Bilac et al. | 361/96 |
| 4,713,718 A | 12/1987 | Quayle | |
| 4,743,816 A | 5/1988 | Prather | |
| 4,743,818 A | 5/1988 | Quayle et al. | |
| 4,757,242 A | 7/1988 | Prather | |
| 5,019,760 A * | 5/1991 | Chu et al. | 318/490 |
| 5,485,491 A | 1/1996 | Salnick et al. | |
| 6,005,757 A * | 12/1999 | Shvach et al. | 361/64 |
| 7,542,256 B2 * | 6/2009 | Premerlani et al. | 361/62 |
| 7,599,161 B2 * | 10/2009 | Premerlani et al. | 361/62 |
| 7,719,811 B2 * | 5/2010 | Brombach et al. | 361/93.1 |
| 2006/0256488 A1 | 11/2006 | Benzing et al. | |

* cited by examiner

*Primary Examiner* — Rita Leykin
(74) *Attorney, Agent, or Firm* — Dawn C. Wolff; Martin J. Moran

(57) ABSTRACT

An electrical switching apparatus is for another apparatus including a number of insulators, a number of temperature sensors operatively associated with the number of insulators, and a number of conductors operatively associated with the number of insulators. The electrical switching apparatus includes a number of separable contacts, an operating mechanism structured to open and close the separable contacts, a number of sensors structured to sense a number of currents flowing through the separable contacts and through the conductors, a processor structured to input the sensed currents from the sensors, and an output. The processor calculates at least one of: (a) a thermal age of the other apparatus from a number of sensed temperatures from the temperature sensors, and (b) the thermal age of the other apparatus from the sensed currents. The output includes the thermal age of the other apparatus.

20 Claims, 4 Drawing Sheets

ELECTRICAL SWITCHING APPARATUS AND PROTECTION APPARATUS DETERMINING THERMAL AGE OF ANOTHER APPARATUS OR A NUMBER OF INSULATORS

BACKGROUND

1. Field

The disclosed concept pertains generally to electrical switching apparatus and, more particularly, to electrical switching apparatus, such as contactors, starters, motor protection relays and circuit breakers. The disclosed concept also pertains to protection relays.

2. Background Information

A starter is a device used to provide protection and control for a motor, such as a three-phase motor and the like, typically used in, for example, various industrial settings to operate machinery. A common type of starter includes an electromagnetic contactor and a motor protection relay. The contactor includes separable contacts that are connected to each phase of the electric motor, such that, when closed, the separable contacts connect the motor to an electrical source, such as a three-phase electrical source. The motor protection relay monitors the load current and, in some cases, voltage, and trips the contactor open if a problem condition, such as persistent overcurrent, arises. Typically, the motor protection relay tracks an ht characteristic of the load current, which is a measure of heating. Motor protection relays typically include a microprocessor, which digitally generates the ht value. When the calculated $I^2t$ value reaches a designated trip level, the contactor is tripped open to interrupt the flow of current to the motor.

U.S. Pat. No. 4,743,818 discloses a multi-function motor protective relay that monitors three-phase alternating current (AC) and makes separate trip and alarm decisions based on pre-programmed motor current and temperature conditions. The temperature of a rotating rotor is inferred from the current flowing in the lines which supply the motor and from resistance temperature detection (RTD) devices in the stator of the motor. A system RTD measures motor stator winding temperatures.

U.S. Pat. No. 5,485,491 discloses an online system for diagnosing operability of a rotating electrical power conversion apparatus. The system includes sensing means for sensing at least one electrical insulation non-thermal parameter of the rotating electrical power conversion apparatus during operation thereof and producing a corresponding at least one electrical variable; data conversion means for converting the at least one electrical variable to a corresponding at least one value; comparison means for comparing the at least one value to a corresponding at least one predetermined baseline value of the rotating electrical power conversion apparatus and producing a corresponding at least one comparison value; and signaling means for outputting at least one signal related to a period of predicted operability of the rotating electrical power conversion apparatus whenever the at least one comparison value exceeds a corresponding at least one predetermined dead band value. Temperature sensors are provided for sensing oil temperature, water inlet temperature, water outlet temperature, oil inlet temperature, and temperature of guide and thrust bearings.

The insulation of a rotating electrical apparatus, such as a motor, has a finite life. Various operating conditions (e.g., without limitation, moisture; temperature; mechanical stress; dust; airborne chemicals), affect the actual time it takes to reach the "end of life" of the motor insulation.

SUMMARY

The most severe of the various operating conditions is the temperature of the winding insulation. Known electrical switching apparatus, such as protection relays (e.g., without limitation, motor protection relays), do not predict aging of winding insulation (e.g., without limitation, motor winding insulation).

There is room for improvement in electrical switching apparatus.

There is further room for improvement in protection relays.

These needs and others are met by embodiments of the disclosed concept, which determines aging effects of operating conditions on the life of an insulation system (e.g., without limitation, a motor's insulation system).

In accordance with one aspect of the disclosed concept, an electrical switching apparatus is for another apparatus including a number of insulators, a number of temperature sensors operatively associated with the number of insulators, and a number of conductors operatively associated with the number of insulators. The electrical switching apparatus comprises: a number of separable contacts; an operating mechanism structured to open and close the number of separable contacts; a number of sensors structured to sense a number of currents flowing through the number of separable contacts and through the number of conductors; a processor structured to input the sensed number of currents from the number of sensors; and an output, wherein the processor is further structured to calculate at least one of: (a) a thermal age of the other apparatus from a number of sensed temperatures from the number of temperature sensors, and (b) the thermal age of the other apparatus from the sensed number of currents, and wherein the output includes the thermal age of the other apparatus.

The processor may be further structured to calculate the thermal age of the other apparatus from the number of sensed temperatures from the number of temperature sensors.

The processor may be further structured to calculate an average temperature of the other apparatus from an average of the number of sensed temperatures from the number of temperature sensors over a predetermined time.

The processor may be further structured to calculate the thermal age of the other apparatus from the sensed number of currents.

The processor may be further structured to calculate an estimated temperature of the other apparatus from $(I_{AVG}/I_{NP})^2 \times (T_{CLASS} - \text{ambient temperature}) + \text{ambient temperature}$; wherein $I_{AVG}$ is RMS current of the other apparatus; wherein $I_{NP}$ is name plate current of the other apparatus; and wherein $T_{CLASS}$ is temperature class of the number of insulators.

The processor may be further structured to determine temperature of the other apparatus and to determine insulation life expectancy of the other apparatus from $e^{(a+b(\ln(TEMP)))}$, wherein a, b and e are constants, ln is the natural logarithm, and TEMP is the determined temperature.

The processor may be further structured to determine the thermal age from a standard insulation life expectancy of the other apparatus at full operating temperature divided by the determined insulation life expectancy.

The processor may be further structured to accumulate the thermal age.

As another aspect of the disclosed concept, a protection relay is for an apparatus including a number of insulators and a number of temperature sensors operatively associated with the number of insulators. The protection relay comprises: an input structured to input a number of sensed temperatures from the number of temperature sensors; a processor structured to calculate a thermal age of the number of insulators from the number of sensed temperatures; and an output including the thermal age of the number of insulators.

The processor may be further structured to calculate an average temperature of the apparatus from an average of the number of sensed temperatures from the number of temperature sensors over a predetermined time; and the processor may be further structured to determine insulation life expectancy of the number of insulators from $e^{(a+b(ln(TEMP)))}$, wherein a, b and e are constants, ln is the natural logarithm, and TEMP is the average temperature.

The processor may be further structured to determine the thermal age from a standard insulation life expectancy of the number of insulators at full operating temperature divided by the determined insulation life expectancy.

As another aspect of the disclosed concept, a protection relay is for an apparatus including a number of insulators and a number of conductors operatively associated with the number of insulators. The protection relay comprises: a number of sensors structured to sense a number of currents flowing through the number of conductors; a processor structured to input the sensed number of currents from the number of sensors and to calculate a thermal age of the number of insulators from the sensed number of currents; and an output including the thermal age of the number of insulators.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term "rotating electrical apparatus" shall expressly include, but not be limited to, motors; generators; HVAC chillers; compressors; induction machines; and generators or motors with multiple independent windings on a common shaft and capable of being independently controlled.

As employed herein, the term "temperature sensor" shall expressly include, but not be limited to, a number of resistance thermometers; resistance temperature detectors (RTDs); platinum resistance thermometers (PRTs); thermistors; thermocouples; and infrared temperature measurement sensors.

The disclosed concept is described in association with a three-phase motor starter 2 and a three-phase motor 4, although the disclosed concept is applicable to a wide range of electrical switching apparatus or protection relays for a wide range of other apparatus, such as, for example and without limitation, rotating electrical apparatus, having any suitable number of phases or poles.

Figure 1:
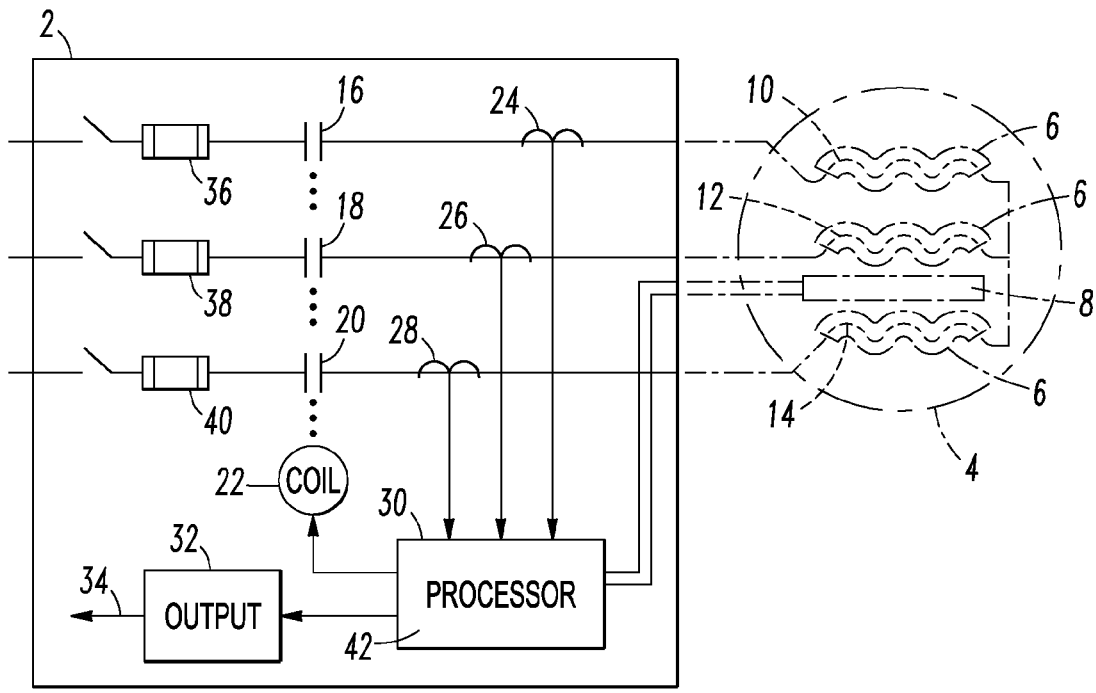
FIG. 1 is a block diagram in schematic form of an electrical switching apparatus in accordance with embodiments of the disclosed concept.

Referring to FIG. 1, an electrical switching apparatus, such as the example motor starter 2, is shown. The example motor starter 2 is for another apparatus, such as, for example and without limitation, a rotating electrical apparatus, such as the example motor 4 (shown in phantom line drawing). The example motor 4 includes a number of insulators 6 (e.g., without limitation, three different insulators 6 are shown), a number of temperature sensors 8 (e.g., without limitation, one resistance temperature detector (RTD) 8 is shown) operatively associated with (e.g., structured to sense the temperature thereof) the number of insulators 6, and a number of conductors 10, 12, 14 (e.g., without limitation, three different phase conductors 10, 12, 14 are shown) operatively associated with (e.g., electrically insulated by) the number of insulators 6. For example, the number of insulators 6 are operatively associated with (e.g., electrically insulate) the number of conductors 10, 12, 14, which form the windings (e.g., without limitation, stator windings) of the example motor 4. For example, although one RTD 8 is shown, a plurality of suitable temperature sensors, such as RTDs, can be provided (e.g., without limitation, one RTD for each of the number of conductors 10, 12, 14).

The example motor starter 2 includes a number of separable contacts 16, 18, 20 (e.g., without limitation, three contactors 16, 18, 20 are shown), and an operating mechanism 22 (e.g., without limitation, a coil) structured to open and close the number of separable contacts 16, 18, 20. The example motor starter 2 also includes a number of sensors 24, 26, 28 (e.g., without limitation, three current sensors 24, 26, 28 are shown) structured to sense a number of currents flowing through the number of separable contacts 16, 18, 20 and through the number of conductors 10, 12, 14, respectively, a processor 30 (e.g., without limitation, a microprocessor) structured to input the sensed number of currents from the number of sensors 24, 26, 28, and an output 32. As will be described in greater detail, below, in connection with FIG. 2, the processor 30 is further structured to calculate at least one of: (a) a thermal age 34 of the example motor 4 from a number of sensed temperatures from the number of temperature sensors 8, and (b) the thermal age 34 of the example motor 4 from the sensed number of currents. As shown, the processor output 32 includes the thermal age 34 of the example motor 4.

Although not required, a corresponding example three-phase power system can optionally include a number of fuses or disconnects 36, 38, 40 electrically connected in series with the number of separable contacts 16, 18, 20, respectively.

Example 1

The output 32 can be a display structured to display the thermal age 34 and a number of a temperature of the example motor 4, insulation life expectancy of the example motor 4, and actual running hours of the example motor 4. For example and without limitation, the display can display the thermal age 34 and the insulation life expectancy of the example motor 4.

Example 2

The output 32 can be a communication network structured to communicate the thermal age 34.

Example 3

The processor 30 can be structured to calculate the thermal age 34 of the example motor 4 from the number of sensed temperatures from the number of temperature sensors 8.

Example 4

The processor 30 can be structured to calculate the thermal age 34 of the example motor 4 from the sensed number of currents from the current sensors 24, 26, 28.

Example 5

Figure 2:
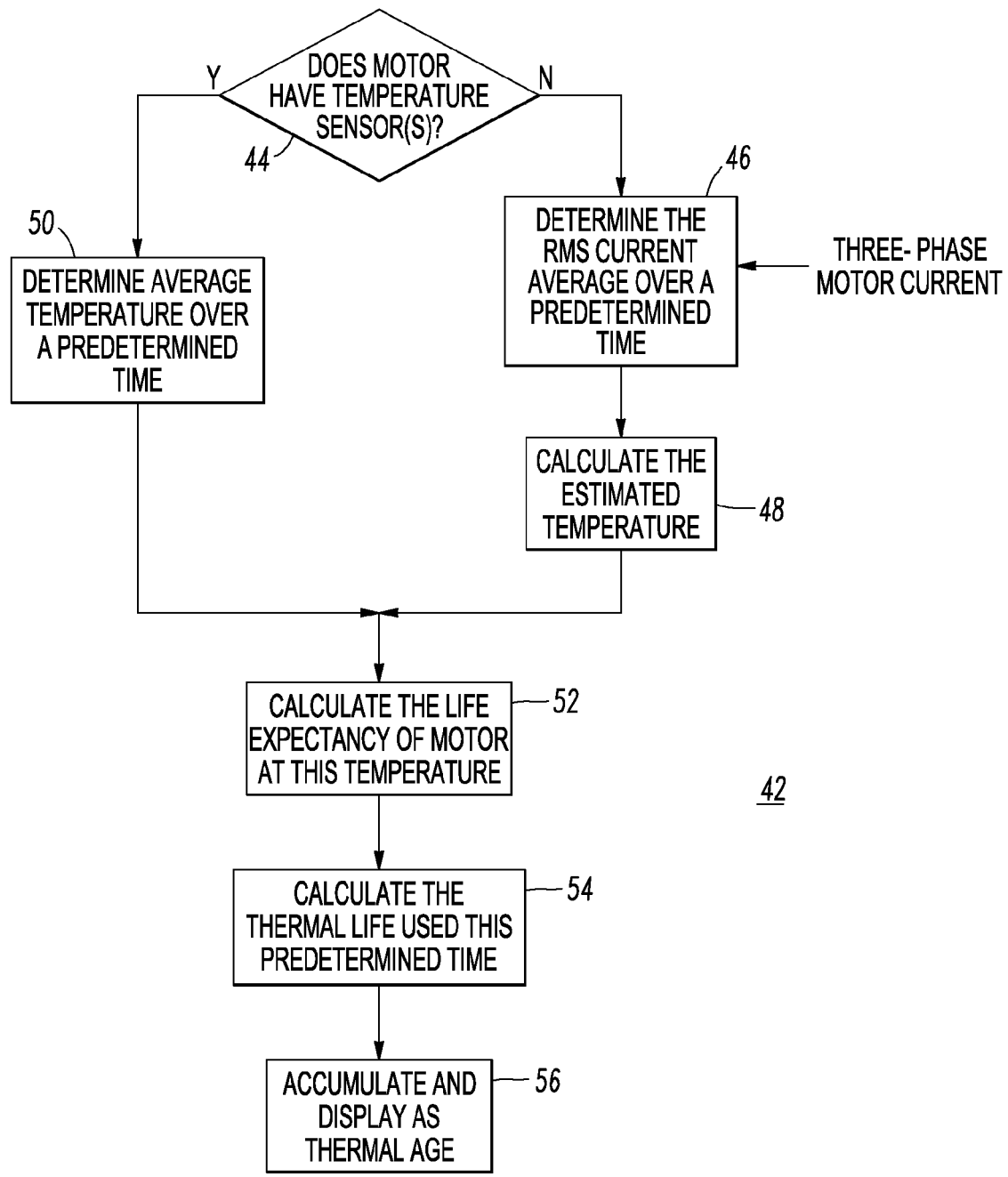
FIG. 2 is a flowchart of a routine of the processor of FIG. 1.

FIG. 2 shows an example routine 42 for the processor 30 of FIG. 1. The example routine 42 provides two alternatives to estimate motor temperature: (1) an average from a number of temperature sensors 8; and (2) RMS motor current averaged over a suitable predetermined time (e.g., without limitation, one hour; any suitable time). It will be appreciated that one or both of these alternatives can be employed.

Example 6

For example, the routine 42 of FIG. 2 can measure motor temperature using the number of RTDs 8 imbedded in the example motor windings 10, 12, 14 of FIG. 1, or can estimate the motor temperature using motor heating based on average current flowing in the example motor 4 of FIG. 1. In either case, the measured or estimated temperature is used to calculate aging of the motor insulation system based on the life expectancy of that insulation system.

Example 7

For example, RTDs, such as 8, are temperature sensors that exploit the predictable change in electrical resistance of some materials with changing temperature. For example, RTDs are used on relatively large motors (e.g., without limitation, over about 200 HP) and are placed, for example and without limitation, six RTDs in the stator, two RTDs, one in each motor bearing well, two RTDs in the load bearing, and another RTD placed at a suitable user-defined position. For example, the RTDs in the stator are sandwiched between the windings, away from the stator core, in order to provide a relatively small temperature error.

The use of RTDs is believed to be the most accurate way to determine temperature since motors experience a loss of cooling ability due to things like dirt on the windings, blockage of intake air, high or low ambient air temperature, and broken cooling fans. For example, RTDs, such as 8, are placed between the windings, such as 12,14, where the heat is in the heart of the motor 4.

Example 8

Alternatively, estimating the motor temperature approximates the temperature rise based on motor currents and the assumptions that the motor 4 is clean, there is no blockage of cooling air, the ambient temperature is 40° C. and the motor cooling fans (not shown) are operating properly. However, unless there is a relatively new motor, these assumptions can be inaccurate.

In the example routine 42 of FIG. 2, first, at 44, it is determined if the motor 4 has RTDs 8. If not, then at 46 and 48, the current flowing to the motor 4 is monitored and the motor temperature rise is calculated. At 46, the routine 42 averages the motor current over a suitable predetermined time (e.g., without limitation, one hour; any suitable time). Next, at 48, the estimated operating temperature is calculated from Equation 1, which assumes that the motor 4 is operating in its maximum ambient temperature (e.g., without limitation, 40° C.; rated ambient temperature; any suitable ambient temperature).

$$T_{EST} = (I_{AVG}/I_{NP})^2 \times (T_{CLASS} - 40°\text{ C.}) + 40°\text{ C.} \tag{Eq. 1}$$

wherein:

$T_{EST}$ is estimated motor temperature over a predetermined time (e.g., without limitation, one hour; any suitable time);

$I_{AVG}$ is RMS motor current for the predetermined time;

$I_{NP}$ is name plate (e.g., full load) current of the motor 4; and $T_{CLASS}$ is temperature class of the insulation 6 (e.g., without limitation, Class A is 105° C.; Class B is 130° C.; Class F is 155° C.; Class H is 180° C.; any suitable insulation temperature class, although the four previous Classes are generally used in motors).

Equation 1 squares the averaged RMS motor current divided by the name plate current of the motor 4. The formula $I^2R$ provides the heat generated by current (I) in amperes flowing through motor windings 10, 12, 14 (e.g., without limitation, copper wire) having a resistance (R) in ohms. The resistance, for all practical purposes, is the same at low load as it is at full load. Therefore, the resistance drops out of Equation 1. The heating (temperature rise) of the motor 4 is, thus, a function of the current squared. The motor 4 is assumed to be at a stable full temperature (e.g., its temperature class at name plate current and 40° C. ambient temperature). The term ($T_{CLASS}$-40° C.) reduces the temperature class to the temperature rise.

On the other hand, if the motor 4 has RTDs 8, then, at 50, the total temperature rise versus ambient temperature is calculated. Here, the operating motor temperature is detected from the RTDs 8 and is averaged over a suitable predetermined time (e.g., without limitation, one hour; any suitable time).

After either 48 or 50, at 52, the insulation life expectancy at the averaged temperature of 50 or the estimated temperature of 48 is calculated using Equations 2 and 3 and Table 1.

$$\ln(HRS) = a + b(\ln(TEMP)) \tag{Eq. 2}$$

$$HRS = e^{\ln(HRS)} = e^{(a + b(\ln(TEMP)))} \tag{Eq. 3}$$

wherein:

ln is the natural logarithm;

HRS is insulation life expectancy at a specific temperature (where 50% of the insulation systems are expected to fail in that time);

a and b are constants as shown, for example, in Table 1, below, for four example temperature classes;

TEMP is averaged or estimated operating temperature; and e is the irrational constant, which is approximately equal to 2.718281828.

TABLE 1

| Temperature Class | a | b |
|---|---|---|
| Class A 105° C. | 45.692 | −7.690 |
| Class B 130° C. | 64.246 | −11.164 |
| Class F 155° C. | 84.093 | −14.710 |
| Class H 180° C. | 68.235 | −11.233 |

Figure 3:
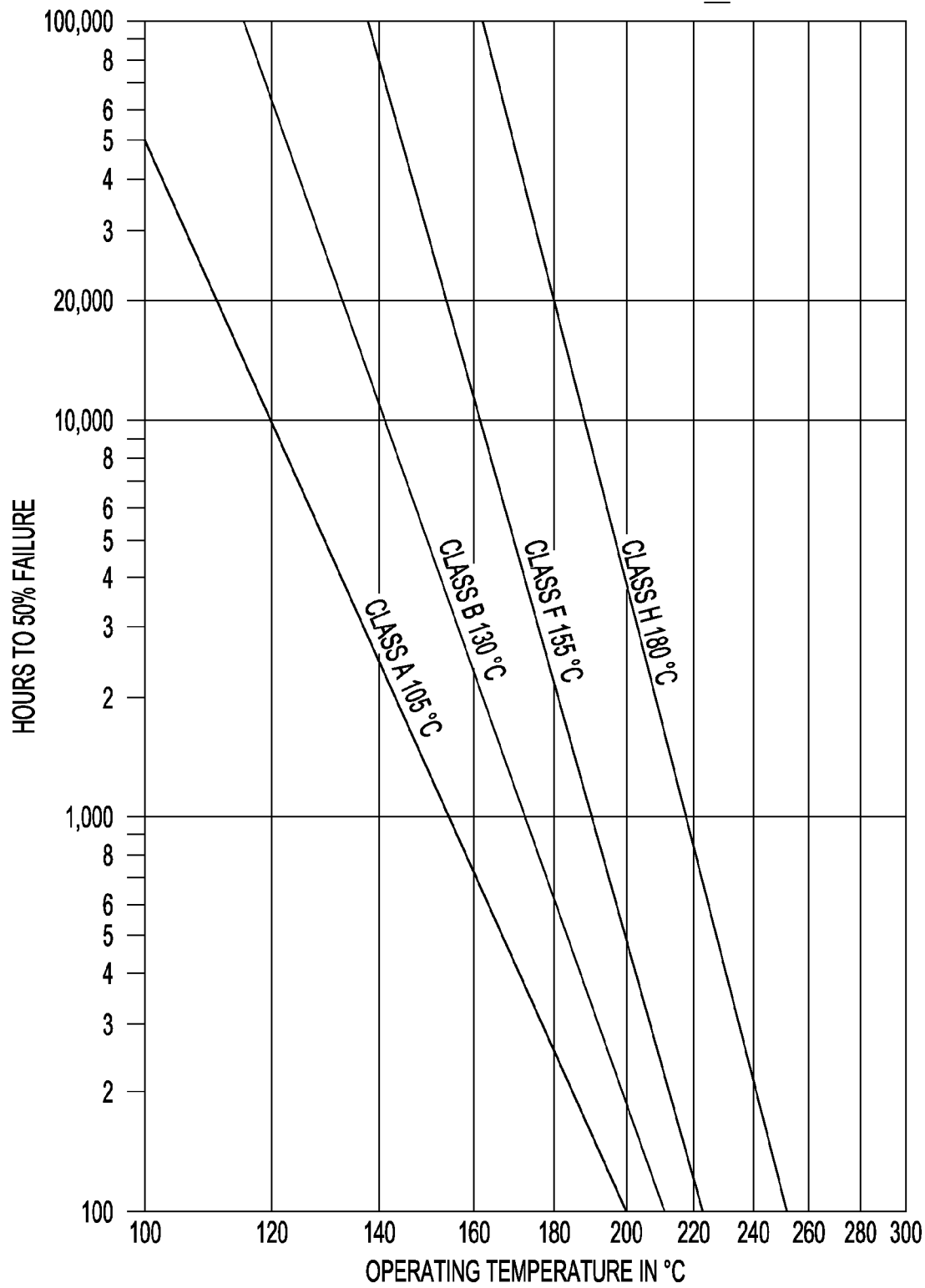
FIG. 3 is a log-log plot of operating temperature versus hours to 50% failure for four temperature classes of insulation systems.

FIG. 3 shows a log-log plot 58 of operating temperature (° C.) versus hours to 50% failure for the four example temperature classes of Table 1.

Referring again to FIG. 2, after 52, at 54, the thermal age (TAGE) or the thermal life used in the previous hour is calculated from Equation 4.

$$TAGE = STD\_LIFE/HRS \tag{Eq. 4}$$

In Equation 4, the insulation life expectancy (HRS) for the previous hour is divided into the standard insulation life expectancy of insulation systems (STD_LIFE) (e.g., 20,000 hours) at full operating temperature, which corresponds, for example, to the life expectancy of a motor operating at full rated temperature. Equations 2-4, above, use averaged or estimated motor temperature to calculate the thermal age of the motor 4 using a base temperature for a standard insulation life expectancy.

Finally, at 56, the thermal age is accumulated as shown in Equation 5, and can be displayed at the processor output 32 (FIG. 1) based upon the sum, updated every predetermined time (e.g., without limitation, every hour; any suitable time), of the previous accumulated thermal age plus the thermal life used in the previous hour. Both thermal hours and actual running hours can be displayed to aid the user in planning motor maintenance.

$$TAGE\_ACCUM = TAGE\_ACCUM + TAGE \tag{Eq. 5}$$

wherein:
TAGE_ACCUM is accumulated thermal age.

Example 9

Figure 4:
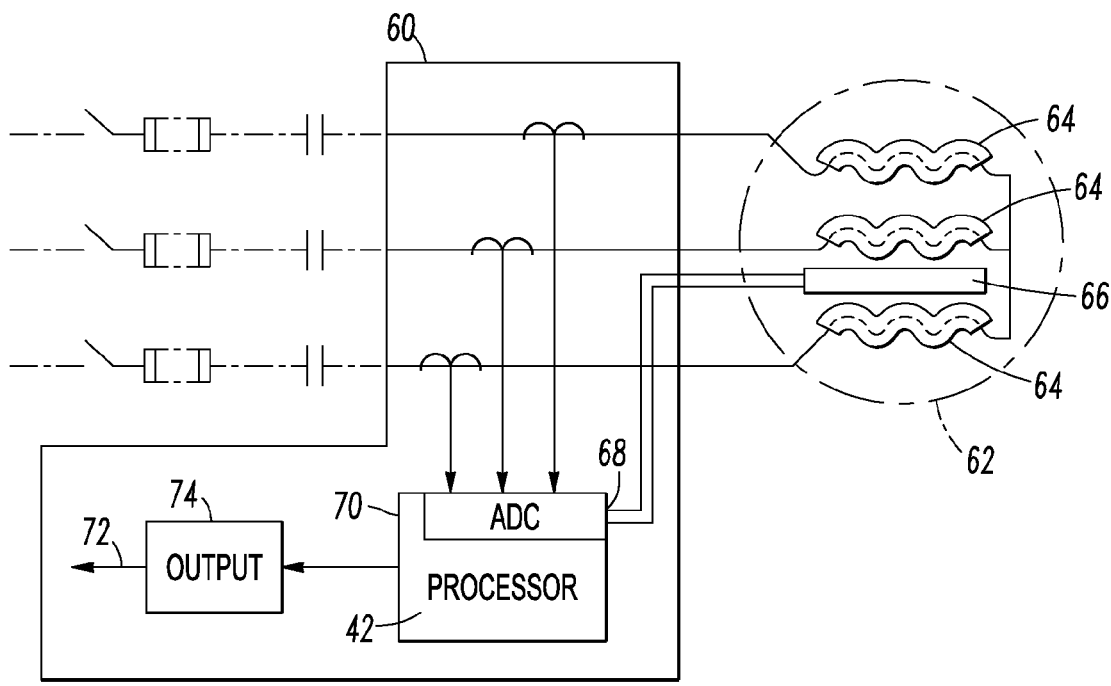
FIGS. 4 and 5 are block diagrams in schematic form of protection relays in accordance with other embodiments of the disclosed concept.

Referring to FIG. 4, a protection relay 60 is for an apparatus 62 including a number of insulators 64 and a number of temperature sensors 66 operatively associated with the number of insulators 64. The protection relay 60 includes a number of inputs 68 structured to input a number of sensed temperatures from the number of temperature sensors 66, a processor 70 structured to calculate a thermal age 72 of the number of insulators 64 from the number of sensed temperatures, and an output 74 including the thermal age 72 of the number of insulators 64.

Similar to the processor 30 and the routine 42 of FIG. 1, the processor 70 can be further structured to calculate an average temperature of the apparatus 62 from an average of the number of sensed temperatures from the number of temperature sensors 66 over a predetermined time, and the processor 70 can be further structured to determine insulation life expectancy of the number of insulators 64 from $e^{(a+b(ln(TEMP)))}$, wherein a, b and e are constants, ln is the natural logarithm, and TEMP is the average temperature.

Similar to the processor 30 and the routine 42 of FIG. 1, the processor 70 can be further structured to determine the thermal age 72 from a standard insulation life expectancy of the number of insulators 64 at full operating temperature divided by the determined insulation life expectancy.

Example 10

Figure 5:
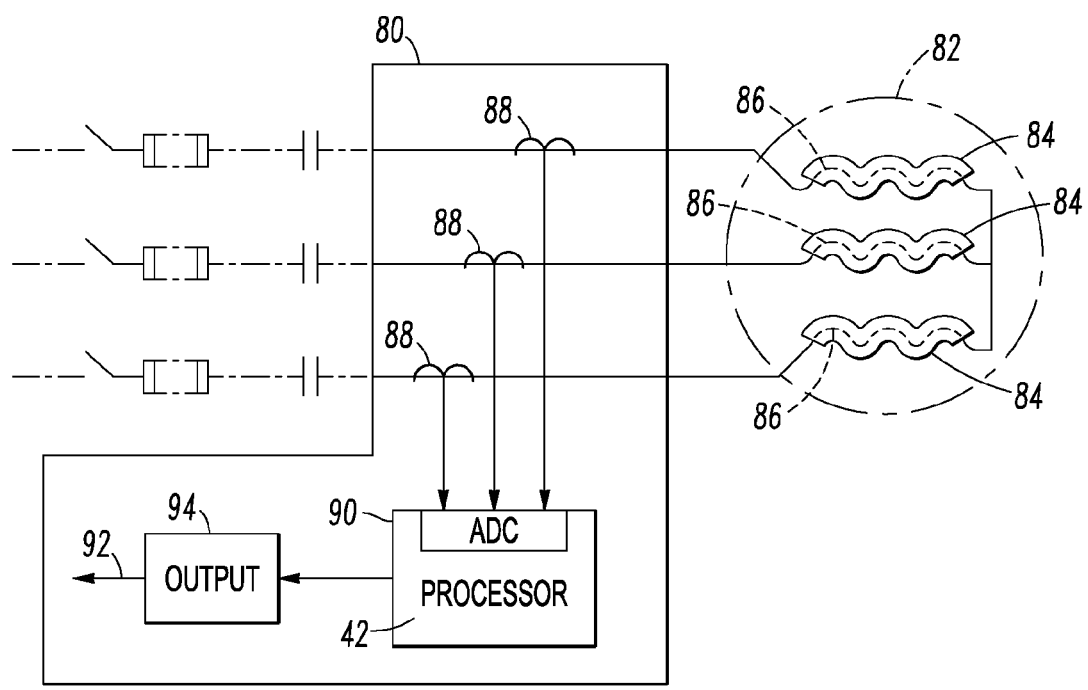

Referring to FIG. 5, a protection relay 80 is for an apparatus 82 including a number of insulators 84 and a number of conductors 86 operatively associated with the number of insulators 84. The protection relay 80 includes a number of sensors 88 structured to sense a number of currents flowing through the number of conductors 86, a processor 90 structured (e.g., without limitation, through an analog to digital convertor (ADC)) to input the sensed number of currents from the number of sensors 88 and to calculate a thermal age 92 of the number of insulators 84 from the sensed number of currents. The protection relay 80 also includes an output 94 including the thermal age 92 of the number of insulators 84.

Example 11

In FIG. 1, the example motor 4 with a number of RTDs 8 is running at 90% load, the ambient temperature is 30° C., and the motor 4 has a class F (155° C.) insulation system. At this load and ambient temperature, the motor RTDs 8 should report about 123° C. From Equations 2 and 3, at this temperature, the insulation life expectancy (HRS) is about 600,000 hours. From Equation 4, the thermal age (TAGE) or the thermal life used in the previous example hour is 20,000/600,000 or about 0.033 hours, instead of one actual hour of running time.

However, if the same motor 4 is running at 110% load at the ambient temperature of 30° C., then the motor RTDs 8 should report a temperature of about 163° C. At this temperature, the insulation life expectancy (HRS) is about 9,500 hours and the thermal age (TAGE) or the thermal life used in the previous example hour is 20,000/9,500 or about 2.09 hours.

Using this information, engineers or other maintenance personnel can decide to start another motor or to put an upgrade into the plan for the next year.

Example 12

If the same motor 4 of Example 1 does not have RTDs 8, then the 90% loading results in a calculated estimated temperature of about 133° C. (=(155° C.−40° C.)×(90/100)$^2$+40° C.) from Equation 1. At this temperature, the insulation life expectancy (HRS) is about 190,225 hours and the thermal age (TAGE) or the thermal life used in the previous example hour is 20,000/190,225 or about 0.11 hours.

Example 13

FIG. 3 can be determined by taking a set of ten or more samples and placing them in an oven at a temperature above the Temperature Class temperature. Four sets of samples are run at four different temperatures. Each set of samples is tested at a suitable high voltage to determine if the insulation system can still withstand its rated voltage. When 50% of each sample set fails, that temperature is plotted on log-log paper to form a line for the set of samples. Where that line passes through the example horizontal 20,000 hour line, the Temperature Class below that line is considered to be the Temperature Class of that insulation system.

Example 14

Further to Example 3, four sets are tested. The first set is at 200° C. and 50% of the samples have failed at 160 hours. The second set is at 190° C. and 50% of the samples have failed at 290 hours. The third set is at 170° C. and 50% of the samples have failed at 1000 hours. The fourth set is at 160° C. and 50% of the samples have failed at 1600 hours or 66 days. When these four sets are plotted, the line crosses the example horizontal 20,000 hour line of FIG. 2 at 135° C. Hence, this insulation system is then assigned a Temperature Class of Class B (130° C.).

Example 15

Actual running hours can be determined based upon, for example, a motor starter, such as 2, being in a run state (e.g., without limitation, when the main contactor 16, 18, 20 is closed and there is current flowing to the motor 4).

Example 16

Insulation life expectancy (HRS), thermal age (TAGE) or the thermal life used in the previous predetermined time, and/or actual running hours can be displayed on a display, such as 32, for user maintenance evaluation. For example, these values can be used by engineers to determine the wear and tear on the motor 4.

Example 17

Although motor protection relays 60,80 are disclosed in FIGS. 4 and 5, the disclosed concept can be used with a wide range of electrical switching apparatus (e.g., without limitation, motor starters; contactors; circuit breakers) or other protection relays.

Example 18

Although a rotating electrical apparatus, such as the example motor 4, is disclosed, the disclosed concept can be used in connection with transformers, motors, generators and any other electrical equipment (e.g., without limitation, power conversion equipment) that has insulation.

Example 19

Although stator windings 10, 12, 14 are disclosed, the disclosed concept can be applied to, for example and without limitation, the rotor windings of a synchronous motor.

Example 20

While for clarity of disclosure reference has been made herein to the example output or display 32 for displaying, for example, insulation life expectancy, thermal age or the thermal life used in the previous predetermined time, and/or actual running hours, it will be appreciated that such information may be stored, printed on hard copy, be computer modified, be communicated for display or use elsewhere, or be combined with other data. All such processing shall be deemed to fall within the terms "display" or "displaying" as employed herein.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electrical switching apparatus for another apparatus including a number of insulators, a number of temperature sensors operatively associated with said number of insulators, and a number of conductors operatively associated with said number of insulators, said electrical switching apparatus comprising:
a number of separable contacts;
an operating mechanism structured to open and close said number of separable contacts;
a number of sensors structured to sense a number of currents flowing through said number of separable contacts and through said number of conductors;
a processor structured to input the sensed number of currents from said number of sensors; and
an output,
wherein said processor is further structured to calculate at least one of: (a) a thermal age of said another apparatus from a number of sensed temperatures from said number of temperature sensors, and (b) the thermal age of said another apparatus from said sensed number of currents, and
wherein said output includes the thermal age of said another apparatus,
wherein said processor is further structured to determine temperature of said another apparatus and to determine insulation life expectancy of said another apparatus from $e^{(a+b(ln(TEMP)))}$, wherein a, b and e are constants, ln is the natural logarithm, and TEMP is said determined temperature.

2. The electrical switching apparatus of claim 1 wherein said another apparatus is a rotating electrical apparatus further including a number of windings and said number of temperature sensors operatively associated with said number of windings, said number of insulators being operatively associated with said number of windings.

3. The electrical switching apparatus of claim 2 wherein said rotating electrical apparatus is a motor; and wherein said number of windings is a number of stator windings of said motor.

4. The electrical switching apparatus of claim 1 wherein said number of temperature sensors is a number of resistance temperature detectors.

5. The electrical switching apparatus of claim 4 wherein said another apparatus is a rotating electrical apparatus; wherein said number of windings is a number of windings of said rotating electrical apparatus; and wherein said number of resistance temperature detectors is operatively associated with said number of windings.

6. The electrical switching apparatus of claim 1 wherein said output is a display.

7. The electrical switching apparatus of claim 6 wherein said display is structured to display said thermal age and a number of a temperature of said another apparatus, insulation life expectancy of said another apparatus, and actual running hours of said another apparatus.

8. The electrical switching apparatus of claim 6 wherein said display is structured to display said thermal age and insulation life expectancy of said another apparatus.

9. The electrical switching apparatus of claim 1 wherein said output is a communication network.

10. The electrical switching apparatus of claim 1 wherein said processor is further structured to calculate said thermal age of said another apparatus from said number of sensed temperatures from said number of temperature sensors.

11. The electrical switching apparatus of claim 10 wherein said processor is further structured to calculate an average temperature of said another apparatus from an average of said number of sensed temperatures from said number of temperature sensors over a predetermined time.

12. The electrical switching apparatus of claim 1 wherein said processor is further structured to calculate said thermal age of said another apparatus from said sensed number of currents.

13. The electrical switching apparatus of claim 12 wherein said processor is further structured to calculate an estimated temperature of said another apparatus from $(I_{AVG}/I_{NP})^2 \times (T_{CLASS}-\text{ambient temperature})+\text{ambient temperature}$; wherein $I_{AVG}$ is RMS current of said another apparatus; wherein $I_{NP}$ is name plate current of said another apparatus; and wherein $T_{CLASS}$ is temperature class of said number of insulators.

14. An electrical switching apparatus for another apparatus including a number of insulators, a number of temperature sensors operatively associated with said number of insulators, and a number of conductors operatively associated with said number of insulators, said electrical switching apparatus comprising:
   a number of separable contacts;
   an operating mechanism structured to open and close said number of separable contacts;
   a number of sensors structured to sense a number of currents flowing through said number of separable contacts and through said number of conductors;
   a processor structured to input the sensed number of currents from said number of sensors; and
   an output,
   wherein said processor is further structured to calculate at least one of: (a) a thermal age of said another apparatus from a number of sensed temperatures from said number of temperature sensors, and (b) the thermal age of said another apparatus from said sensed number of currents,
   wherein said output includes the thermal age of said another apparatus,
   wherein said processor is further structured to determine a temperature from an average of the number of sensed temperatures over a predetermined time period or an average of the sensed number of currents over the predetermined time period,
   wherein said processor is further structured to determine an insulation life expectancy from the determined temperature,
   wherein said processor is further structured to determine a thermal age used in the predetermined time period from a standard insulation life expectancy of said another apparatus at full operating temperature divided by said determined insulation life expectancy, and
   wherein said processor is further structured to accumulate the thermal age of said another apparatus from a previously accumulated thermal age plus said thermal age used in the predetermined time period.

15. The electrical switching apparatus of claim 1 wherein said processor is further structured to determine said thermal age from a standard insulation life expectancy of said another apparatus at full operating temperature divided by said determined insulation life expectancy.

16. The electrical switching apparatus of claim 15 wherein said processor is further structured to accumulate said thermal age.

17. A protection relay for an apparatus including a number of insulators and a number of temperature sensors operatively associated with said number of insulators, said protection relay comprising:
   an input structured to input a number of sensed temperatures from said number of temperature sensors;
   a processor structured to calculate a thermal age of said number of insulators from said number of sensed temperatures; and
   an output including the thermal age of said number of insulators,
   wherein said processor is further structured to calculate an average temperature of said apparatus from an average of said number of sensed temperatures from said number of temperature sensors over a predetermined time; and wherein said processor is further structured to determine insulation life expectancy of said number of insulators from $e^{(a+b(ln(TEMP)))}$, wherein a, b and e are constants, ln is the natural logarithm, and TEMP is said average temperature.

18. The protection relay of claim 17 wherein said processor is further structured to determine said thermal age from a standard insulation life expectancy of said number of insulators at full operating temperature divided by said determined insulation life expectancy.

19. A protection relay for an apparatus including a number of insulators and a number of conductors operatively associated with said number of insulators, said protection relay comprising:
   a number of sensors structured to sense a number of currents flowing through said number of conductors;
   a processor structured to input the sensed number of currents from said number of sensors and to calculate a thermal age of said number of insulators from said sensed number of currents; and
   an output including the thermal age of said number of insulators,
   wherein said processor is further structured to calculate an estimated temperature of said apparatus from $(I_{AVG}/I_{NP})^2 \times (T_{CLASS}-\text{ambient temperature})+\text{ambient temperature}$; wherein $I_{AVG}$ is average RMS current of said sensed number of currents; wherein $I_{NP}$ is name plate current of said apparatus; wherein $T_{CLASS}$ is temperature class of said number of insulators; and wherein said processor is further structured to determine insulation life expectancy of said number of insulators from $e^{(a+b(ln(TEMP)))}$, wherein a, b and e are constants, ln is the natural logarithm, and TEMP is said estimated temperature.

20. The protection relay of claim 19 wherein said processor is further structured to determine said thermal age from a standard insulation life expectancy of said number of insulators at full operating temperature divided by said determined insulation life expectancy.

* * * * *